United States Patent
Liu (10) Patent No.: US 12,119,286 B2
(45) Date of Patent: Oct. 15, 2024

(54) DIE, MEMORY AND METHOD OF MANUFACTURING DIE

(71) Applicant: CHANGXIN MEMORY TECHNOLOGIES, INC., Hefei (CN)

(72) Inventor: ChihCheng Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 339 days.

(21) Appl. No.: 17/647,883

(22) Filed: Jan. 13, 2022

(65) Prior Publication Data

US 2022/0375824 A1   Nov. 24, 2022

Related U.S. Application Data

(63) Continuation of application No. PCT/CN2021/113127, filed on Aug. 17, 2021.

(30) Foreign Application Priority Data

May 19, 2021 (CN) .......................... 202110547018.3

(51) Int. Cl.
*H01L 21/00* (2006.01)
*H01L 21/768* (2006.01)
(Continued)

(52) U.S. Cl.
CPC ...... *H01L 23/481* (2013.01); *H01L 21/76898* (2013.01); *H01L 23/5283* (2013.01); *H01L 23/53228* (2013.01); *H01L 23/53257* (2013.01); *H01L 25/0657* (2013.01); *H01L 2225/06541* (2013.01)

(58) Field of Classification Search
CPC ............. H01L 23/481; H01L 21/76898; H01L 23/5283
See application file for complete search history.

(56) References Cited

U.S. PATENT DOCUMENTS 8,390,120 B2 * 3/2013 Moon .................. H01L 23/481
257/E21.597
9,006,102 B2 * 4/2015 Hong ................ H01L 21/76847
257/E21.159
(Continued)

FOREIGN PATENT DOCUMENTS

CN   102299136 A   12/2011
CN   104600060 A   5/2015
(Continued)

OTHER PUBLICATIONS

International Search Report cited in PCT/CN2021/113127 mailed Feb. 17, 2022, 8 pages.

*Primary Examiner* — Laura M Menz
(74) *Attorney, Agent, or Firm* — Syncoda LLC; Feng Ma (57) ABSTRACT

A die, a memory and a method of manufacturing the die are provided. The die includes a substrate and a conductive structure, where the substrate has an interconnection structure layer, the conductive structure includes a first conductive structure and a second conductive structure connected with the first conductive structure, the first conductive structure is connected with the interconnection structure layer, and a coefficient of thermal expansion of the first conductive structure is smaller than that of copper.

19 Claims, 10 Drawing Sheets

(51) Int. Cl.
*H01L 23/48* (2006.01)
*H01L 23/528* (2006.01)
*H01L 23/532* (2006.01)
*H01L 25/065* (2023.01)

(56) References Cited

U.S. PATENT DOCUMENTS

| | | | | |
|---|---|---|---|---|
| 9,147,642 | B2* | 9/2015 | Lin | H01L 23/481 |
| 9,269,651 | B2* | 2/2016 | Hong | H01L 21/76877 |
| 11,088,099 | B2 | 8/2021 | Katkar et al. | |
| 2011/0073997 | A1* | 3/2011 | Leuschner | H01L 21/76846 257/E21.597 |
| 2012/0267788 | A1* | 10/2012 | Hong | H01L 21/76898 257/774 |
| 2012/0306084 | A1* | 12/2012 | Wood | H01L 23/481 438/618 |
| 2015/0021773 | A1* | 1/2015 | Lee | H01L 21/76816 257/751 |
| 2015/0179547 | A1* | 6/2015 | Hong | H01L 23/528 257/774 |
| 2019/0385966 | A1 | 12/2019 | Gao et al. | |
| 2022/0375824 | A1* | 11/2022 | Liu | H01L 23/481 |
| 2022/0375861 | A1* | 11/2022 | Or-Bach | H01L 27/1211 |
| 2023/0005790 | A1* | 1/2023 | Liu | H01L 21/76898 |
| 2023/0005849 | A1* | 1/2023 | Chuang | H01L 24/05 |
| 2023/0005866 | A1* | 1/2023 | Chuang | H01L 23/481 |
| 2023/0008118 | A1* | 1/2023 | Liu | H01L 23/48 |
| 2023/0145031 | A1* | 5/2023 | Hu | H01L 24/08 257/782 |
| 2023/0197652 | A1* | 6/2023 | Chen | H01L 24/80 257/621 |

FOREIGN PATENT DOCUMENTS

| | | | | |
|---|---|---|---|---|
| CN | 109860103 | A | 6/2019 | |
| CN | 112534574 | A | 3/2021 | |
| CN | 115376993 | A * | 11/2022 | H01L 21/76829 |
| CN | 115706080 | A * | 2/2023 | H01L 21/76898 |
| TW | 201843772 | A | 12/2018 | |
| WO | WO-2022241962 | A1 * | 11/2022 | H01L 21/76829 |
| WO | WO-2023010601 | A1 * | 2/2023 | H01L 21/76898 |

* cited by examiner

DIE, MEMORY AND METHOD OF MANUFACTURING DIE

CROSS-REFERENCE TO RELATED APPLICATIONS

The disclosure is a continuation application of International Patent Application No. PCT/CN2021/113127, titled "DIE, MEMORY AND METHOD OF MANUFACTURING DIE" and filed on Aug. 17, 2021, which claims the priority to Chinese Patent Application No. 202110547018.3, titled "DIE, MEMORY AND METHOD OF MANUFACTURING DIE" and filed with the China National Intellectual Property Administration (CNIPA) on May 19, 2021. The entire contents of International Patent Application No. PCT/CN2021/113127 and Chinese Patent Application No. 202110547018.3 are incorporated herein by reference.

TECHNICAL FIELD

The disclosure relates to, but not limited to a memory and a method of manufacturing the die.

BACKGROUND

With the continuous development of design and manufacturing of integrated circuits, electronic products have become miniaturized and highly integrated, and the stacked die packaging technology comes into being. The stacked die packaging technology, also known as a three-dimensional packaging technology, refers to stacking more than two dies in a perpendicular direction within a same package. For example, in a dynamic random access memory (DRAM for short), a plurality of dies are perpendicularly stacked and intercommunicated through the three-dimensional packaging technology, so as to improve the memory capacity of the DRAM.

In the stacked dies, each die generally includes a substrate and an interconnection structure layer arranged on the substrate. A corresponding via is formed on each die by using a through silicon via (TSV for short) technology; the via is filled with a conductive material, such as copper, to form a TSV structure; and one end of the TSV structure is connected with the interconnection structure layer while the other end thereof is used to connect another die adjacent to the die, so as to realize conduction between two adjacent dies.

However, a gap is prone to be formed between the substrate and the interconnection structure layer, which may reduce the performance of the dies.

SUMMARY

A first aspect of the embodiments of the disclosure provides a die, including:

a substrate, where an interconnection structure layer is arranged on the substrate; and a conductive structure arranged within the substrate, where the conductive structure includes a first conductive structure and a second conductive structure connected with the first conductive structure, the first conductive structure is connected with the interconnection structure layer, and a coefficient of thermal expansion of the first conductive structure is smaller than a coefficient of thermal expansion of copper.

A second aspect of the embodiments of the disclosure provides a memory, including a plurality of dies as mentioned above, where the plurality of dies are stacked in sequence, and two adjacent layers of dies are connected through the interconnection structure layer.

A third aspect of the embodiments of the disclosure provides a method of manufacturing a die, including:

providing a substrate, where an intermetallic dielectric layer is arranged on the substrate, and an etching stop layer is arranged within the intermetallic dielectric layer;

forming a first conductive structure within the intermetallic dielectric layer, where a bottom of the first conductive structure is in contact with the etching stop layer, and a coefficient of thermal expansion of the first conductive structure is smaller than a coefficient of thermal expansion of copper;

forming an interconnection structure layer on the intermetallic dielectric layer, where the interconnection structure layer is connected with one end of the first conductive structure away from the substrate; and forming a second conductive structure within the substrate, where the second conductive structure extends into the intermetallic dielectric layer and is connected with the first conductive structure.

DETAILED DESCRIPTION

A dynamic random access memory generally includes a plurality of dies that are stacked in sequence along a perpendicular direction. Adjacent dies are connected through a conductive structure. For example, before the stacking, a via is firstly formed on each die by using plasma etching. After the via is formed, copper is formed in the via by using a deposition process, so as to form a TSV structure in each die. One end of the conductive layer is connected with an interconnection structure layer of the die while the other end of the TSV structure is connected with an interconnection structure layer of another die adjacent to the die.

In a bonding process, copper is susceptible to thermal expansion, such that one end of the TSV structure away from the substrate protrudes toward the interconnection structure layer and the interconnection structure layer deviates along a direction perpendicular to the substrate. As a result, the substrate is separated from the interconnection structure layer, reducing the performance of the die.

The inventors have found that an existing die has a defect of deviation of a substrate and an interconnection structure layer, but this defect is not noticed. Based on this, the embodiments of the disclosure provide a die, a memory and a method of manufacturing the die. A coefficient of thermal expansion of the conductive structure at a position in contact with the interconnection structure layer is reduced by arranging the conductive structure into a first conductive structure and a second conductive structure and enabling a coefficient of thermal expansion of the first conductive structure to be smaller than that of copper. In this way, there is no gap formed between the substrate and the interconnection structure layer in a process of forming the conductive structure or in a working process of the die, thereby improving the performance of the die.

In order to make the objectives, features and advantages of the embodiments of the disclosure clearer, the technical solutions in the embodiments of the disclosure are described clearly and completely below with reference to the accompanying drawings in the embodiments of the disclosure. Apparently, the described embodiments are some rather than all of the embodiments of the present disclosure. All other embodiments obtained by a person of ordinary skill in the art substrated on the embodiments of present disclosure without creative efforts should fall within the protection scope of the present disclosure.

Figure 1:
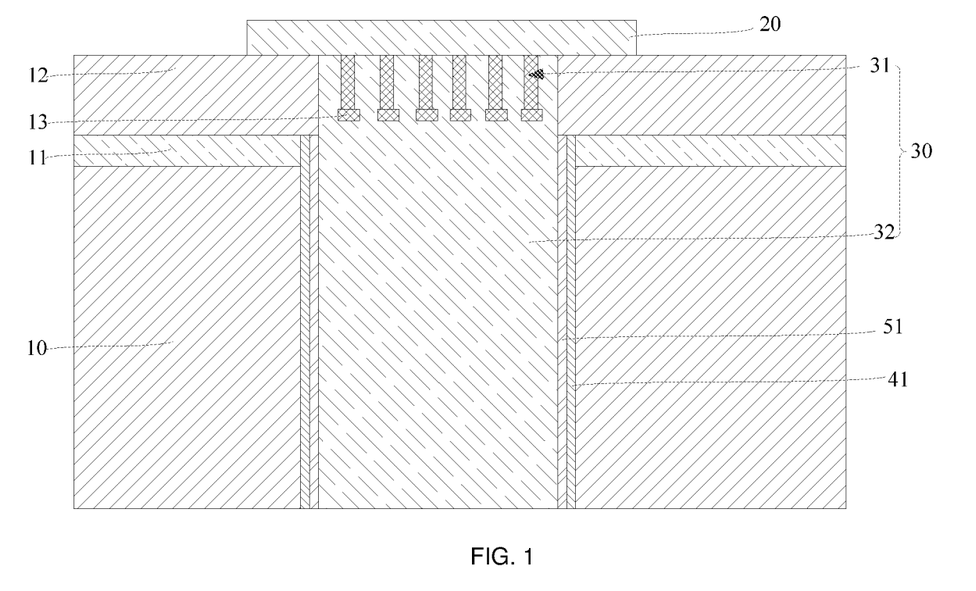
FIG. 1 is a schematic structural diagram of a die according to an embodiment of the disclosure.

As shown in FIG. 1, an embodiment of the disclosure provides a die, including a substrate 10. The substrate 10 serves as a support component of the die and is used to support other components provided thereon. The substrate 10 may be made of a semiconductor material, and the semiconductor material may be one or more of silicon, germanium, a silicon-germanium compound and a silicon-carbon compound.

A functional device may be arranged within the substrate 10, for example, the substrate 10 may include an array region and a peripheral circuit region connected with the array region. A plurality of capacitors in array arrangement may be arranged within the array region, and a transistor for controlling the capacitors may be arranged within the peripheral circuit region.

An interconnection structure layer 20 is arranged on the substrate 10, where a wire may be arranged within the interconnection structure layer 20, one end of the wire may be connected with the transistor while the other end thereof may be connected with the capacitors, and connection between the transistor and the capacitor is achieved through the interconnection structure layer.

It should be noted that the wire within the interconnection structure layer may be a whole conductive layer or a plurality of conductive blocks arranged at intervals, which is not specifically limited herein.

To increase the memory capacity of a memory, a plurality of dies are generally stacked together along a perpendicular direction, correspondingly, a conductive structure 30 needs to be arranged on each die, and by using the conductive structure 30, the conduction of the plurality of dies along the perpendicular direction is achieved.

In other words, the conductive structure 30 is arranged within the substrate 10. One end of the conductive structure 30 may be connected with the interconnection structure layer 20 while the other end thereof may be connected with an interconnection structure layer 20 of a die adjacent to the die.

To ensure electric connection between the conductive structure and an active area of the substrate, an oxide layer 41 and a barrier layer 51 that are stacked are arranged between the conductive structure 30 and the substrate 10, where a material of the oxide layer 41 generally includes silicon oxide, a material of the barrier layer 51 generally includes tantalum, a thickness of the barrier layer 51 is between 2,000 A and 5,000 A, and tantalum has conductivity while preventing penetration between a conductive material in the conductive structure and the substrate, thereby ensuring the performance of the die.

The conductive structure 30 may have various shapes, for example, the conductive structure 30 may be a cylinder, where a diameter of the conductive structure may be 2 micrometers to 10 micrometers, and a height of the conductive structure is 5 micrometers to 100 micrometers.

Exemplarily, the conductive structure 30 may include a first conductive structure 31 and a second conductive structure 32 connected with the first conductive structure 31, where the first conductive structure 31 is connected with the interconnection structure layer 20, and a coefficient of thermal expansion of the first conductive structure 31 is smaller than that of copper.

It should be noted that a coefficient of thermal expansion of the second conductive structure may be smaller than or same as that of copper. For example, a material of the second conductive structure is same as that of the first conductive structure, such as tungsten. For another example, the material of the second conductive structure is different from that of the first conductive structure, where the material of the first conductive structure includes tungsten, and the material of the second conductive structure includes copper, such that the cost of the conductive structure may be reduced, thereby reducing the cost of the die.

In a related art, the conductive structure is generally made of copper which has a larger coefficient of thermal expansion, and in a working process of the die, the conductive structure or other functional devices may generate larger heat, so that the conductive structure is heated to expand, and a surface of the conductive structure in contact with the interconnection structure layer may protrude toward the interconnection structure layer; therefore, the interconnection structure layer deviates along a direction away from the conductive structure and then the interconnection structure layer is separated from the conductive structure, thereby reducing the performance and yield of the die.

Therefore, the material of the conductive structure is improved by the embodiment of the disclosure, and a coefficient of thermal expansion of the conductive layer at a position in contact with the interconnection structure layer is reduced by enabling the coefficient of thermal expansion of the first conductive structure to be smaller than that of copper. In this way, there is no gap formed between the substrate and the interconnection structure layer in a process of forming the conductive structure or in the working process of the die, thereby improving the performance of the die.

In some embodiments, to prevent electric connection between the interconnection structure layer and the active area in the substrate, an intermetallic dielectric layer 12 is generally arranged between the substrate 10 and the interconnection structure layer 20, where a material of the intermetallic dielectric layer 12 includes silicon oxide.

When the die includes the intermetallic dielectric layer, by taking a structure as shown in FIG. 1 as an example, the first conductive structure 31 is located within the intermetallic dielectric layer 12, and one part of the second conductive structure 32 is located within the intermetallic dielectric layer 12 while the other part thereof is located within the substrate 10.

A connection manner of the first conductive structure 31 and the second conductive structure 32 may be described in the following two implementations. It should be noted that the following two implementations are only illustrative of two possible implementations, rather than to limit the arrangement of the first conductive structure and the second conductive structure.

In one implementation, the first conductive structure 31 and the second conductive structure 32 are stacked, that is, the first conductive structure 31 is arranged above the second conductive structure 32, and the material of the first conductive structure 31 includes tungsten. A coefficient of thermal expansion of tungsten is smaller than that of copper, so that a coefficient of thermal expansion of the conductive structure at a position connected with the interconnection structure layer is reduced, and a gap is prevented from being formed between the substrate and the interconnection structure layer, thereby improving the performance of the die.

In another implementation, with further reference to FIG. 1, the first conductive structure 31 is arranged within the second conductive structure 32, a top surface of the first conductive structure 31 is flush with a top surface of the second conductive structure 32, the material of the first conductive structure 31 includes tungsten, and the material of the second conductive structure 32 includes copper.

In other words, the second conductive structure 32 wraps outside the first conductive structure 31, such that the coefficient of thermal expansion of the conductive structure connected with the interconnection structure layer may be reduced, and a volume of the first conductive structure may also be reduced, thereby reducing the manufacturing cost of the first conductive structure.

It should be noted that, in the embodiment, the first conductive structure may be an integrated member or a split member, that is, the first conductive structure includes a plurality of sub-structures.

Figure 2:
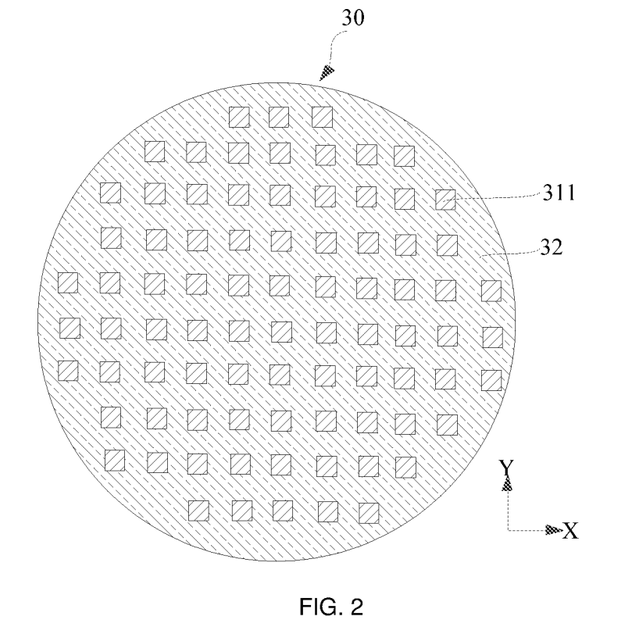
FIG. 2 is a first schematic structural diagram of a conductive structure according to an embodiment of the disclosure.

Exemplarily, as shown in FIG. 2, as a possible implementation of the first conductive structure, the first conductive structure 31 may include a plurality of cylindrical bodies 311 arranged at intervals, and the plurality of cylindrical bodies 311 are embedded within the second conductive structure 32, where axes of the cylindrical bodies 311 are perpendicular to the substrate.

With further reference to FIG. 1, the plurality of cylindrical bodies 311 may be arranged at intervals within the substrate 10, and the second conductive structure 32 wraps outside the cylindrical bodies. Through the arrangement of the plurality of independent cylindrical bodies, the volume of the first conductive structure may be reduced to reduce a dosage of the metal tungsten, thereby reducing the manufacturing cost of the first conductive structure.

It should be noted that, in the embodiment, the plurality of cylindrical bodies 311 may be arranged in a regular array, that is, the plurality of cylindrical bodies 311 are arranged in a plurality of lines and a plurality of rows, where the numbers of the cylindrical bodies 311 in adjacent lines may be equal or unequal. For example, as shown in FIG. 2, along a radial direction of the conductive structure 30, namely, a Y direction as shown in FIG. 2, the numbers of the cylindrical bodies 311 in the lines may climb up and then decline, that is, the number of the cylindrical bodies 311 in the second line is greater than that of the cylindrical bodies 311 in the first line, the number of the cylindrical bodies 311 in the third line is greater than that of the cylindrical bodies 311 in the second line, the number of the cylindrical bodies 311 in the fourth line is equal to that of the cylindrical bodies 311 in the third line, the number of the cylindrical bodies 311 in the fifth line is greater than that of the cylindrical bodies 311 in the fourth line, and the numbers of the cylindrical bodies 311 in the sixth to tenth lines decline.

By taking a plane parallel to the substrate 10 as a cross section, cross sections of the cylindrical bodies 311 may be circular, that is, the cylindrical bodies 311 may be cylinders; or the cross sections of the cylindrical bodies 311 may be polygonal, such as quadrangular, pentagonal or hexagonal and the like.

Along a direction perpendicular to an axis of the conductive structure 30, widths of the cylindrical bodies 311 are between 0.07 micrometer and 0.2 micrometer, which may reduce the coefficient of thermal expansion of the conductive structure and reduce the manufacturing cost of the first conductive structure.

Figure 3:
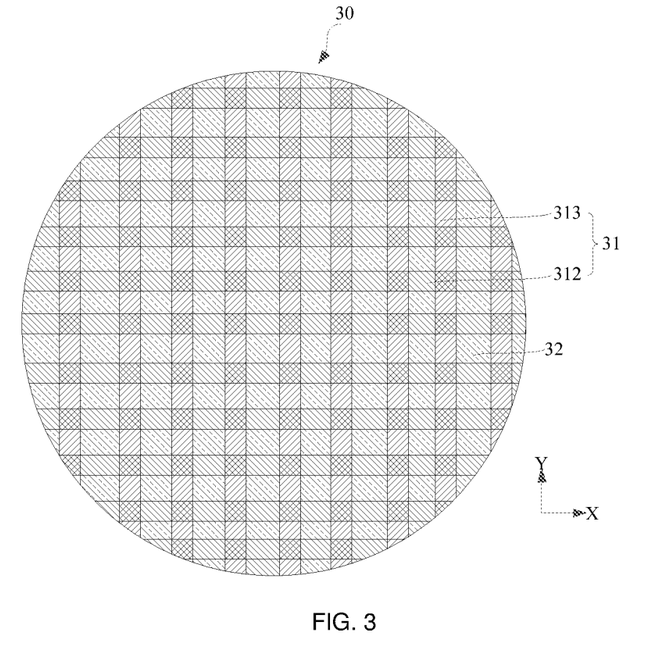
FIG. 3 is a second schematic structural diagram of the conductive structure according to an embodiment of the disclosure.
Figure 4:
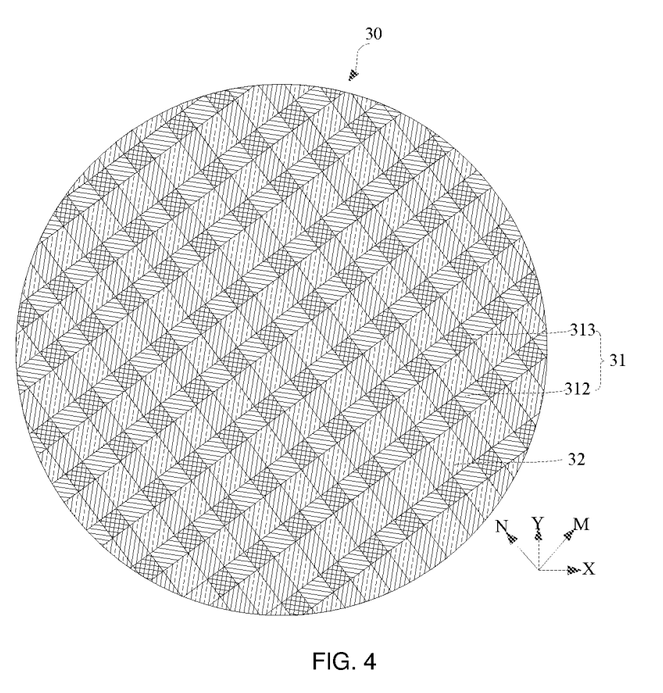
FIG. 4 is a third schematic structural diagram of the conductive structure according to an embodiment of the disclosure.

As shown in FIGS. 3 and 4, as another implementation of the first conductive structure 31, the first conductive structure 31 includes a first strip-shaped body 312 and a second strip-shaped body 313 intersected with the first strip-shaped body 312. Both the first strip-shaped body 312 and the second strip-shaped body 313 are embedded within the second conductive structure 32, and both a depth direction of the first strip-shaped body 312 and a depth direction of the second strip-shaped body 313 are perpendicular to the substrate 10.

In the embodiment, the first strip-shaped body may have a regular shape, such as a rectangle or a fold-line shape. Exemplarily, the first strip-shaped body 312 may extend along a first direction, the second strip-shaped body 313 may extend along a second direction, and the first direction is intersected with the second direction.

It should be noted that the first direction and an X direction may be parallel to each other or have a certain included angle. For example, as shown in FIG. 3, the first strip-shaped body 312 may extend along the X direction and the second strip-shaped body 313 may extend along the Y direction, such that extension directions of the first strip-shaped body 312 and the second strip-shaped body 313 are perpendicular to each other, thereby facilitating the preparation of the first strip-shaped body and the second strip-shaped body.

For another example, as shown in FIG. 4, the first direction M and the X direction form an acute angle, and the second direction N and the X direction form an obtuse angle, such that the first strip-shaped body 312 and the second strip-shaped body 313 are obliquely arranged with respect to the X direction; and the first direction and the second direction may or may not be perpendicular to each other, preferably, the first direction and the second direction are perpendicular to each other.

There may be one or more first strip-shaped bodies 312 and second strip-shaped bodies 313. Exemplarily, as shown in FIGS. 3 and 4, there are a plurality of first strip-shaped bodies 312 and the plurality of first strip-shaped bodies 312 are arranged at intervals along the second direction; and there are a plurality of second strip-shaped bodies 313 and the plurality of second strip-shaped bodies 313 are arranged at intervals along the first direction.

Through the arrangement of the plurality of first strip-shaped bodies and the plurality of second strip-shaped bodies, a proportion of the first conductive structure in the conductive structure may be increased, and the coefficient of thermal expansion of the conductive structure may be sufficiently reduced, so that a gap is prevented from being formed between the substrate and the interconnection structure layer, thereby improving the performance of the die.

To facilitate the preparation of the first strip-shaped bodies and the second strip-shaped bodies, by taking a plane perpendicular to the substrate 10 as a longitudinal section, both longitudinal sections of each of the first strip-shaped bodies 312 and each of the second strip-shaped bodies 313 are rectangular.

An embodiment of the disclosure further provides a memory, including a plurality of dies in the above embodiment, where the plurality of dies are stacked in sequence, and every two adjacent dies are connected through a conductive structure.

The memory provided in the embodiment has the conductive structure in the above embodiment. Therefore, the memory may reduce a coefficient of thermal expansion of the conductive layer at a position in contact with an interconnection structure layer. In this way, there is no gap formed between a substrate of each die and the interconnection structure layer in a process of forming the conductive structure or in a working process of the die, thereby improving the performance of each die and then improving the performance of the memory.

Figure 5:
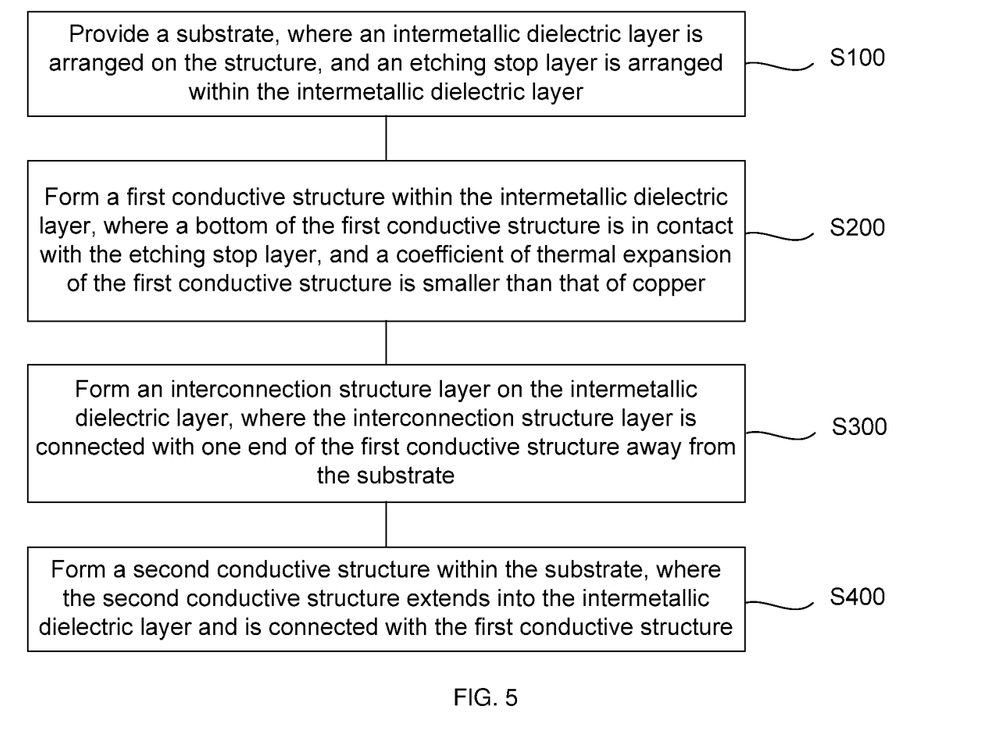
FIG. 5 is a process flowchart of a method of manufacturing a die according to an embodiment of the disclosure.

An embodiment of the disclosure further provides a method of manufacturing a die, including the following steps shown in FIG. 5.

Step S100: provide a substrate, where an intermetallic dielectric layer is arranged on the substrate, and an etching stop layer is arranged within the intermetallic dielectric layer.

Figure 6:
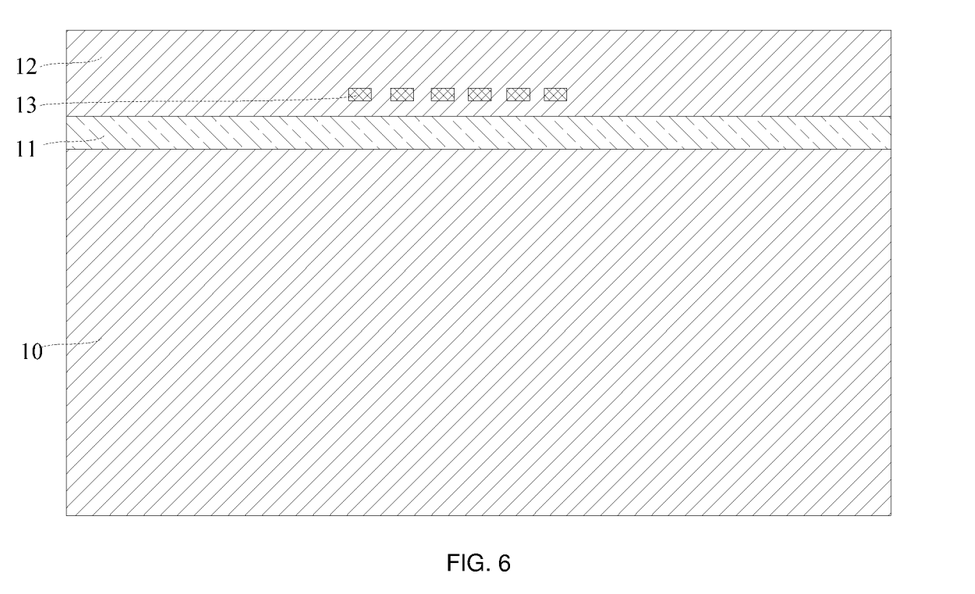
FIG. 6 is a schematic structural diagram of a substrate in the method of manufacturing a die according to an embodiment of the disclosure.

As shown in FIG. 6, the substrate 10 may be a semiconductor substrate, for example, a silicon (Si) substrate; where, apparently, the embodiment of the disclosure is not limited; and exemplarily, the substrate may also be a germanium (Ge) substrate, silicon on insulator (SOI for short), a silicon germanium (SiGe) substrate, a silicon carbide (SiC) or gallium nitride (GaN) substrate and the like.

An isolation structure 11 may be arranged within the substrate 10 and is used to divide the substrate 10 into a plurality of active areas in array arrangement; and it should be noted that FIG. 6 shows only a part of the isolation structure and a part of the substrate, and not the entire substrate and all of the isolation structure arranged within the substrate.

The intermetallic dielectric layer 12 may be formed on the substrate 10 through a physical vapor deposition process or a chemical vapor deposition process, where an etching stop layer 13 is formed within the intermetallic dielectric layer 12, where a material of the etching stop layer may include tungsten, and the etching stop layer 13 is used to prevent over etching when a filling region is subsequently formed, thereby ensuring the performance of the die; and in addition, the etching stop layer is made of tungsten, and compared with an etching stop layer made of copper in a related technology, the etching stop layer made of tungsten may sufficiently reduce a coefficient of thermal expansion of a first conductive structure and prevent a gap from being formed between the substrate and an interconnection structure layer, thereby improving the performance of the die.

It should be noted that the etching stop layer 13 may be a whole layer structure or a plurality of etching stop blocks arranged at intervals, which is not specifically limited herein.

Step S200: form the first conductive structure within the intermetallic dielectric layer, where a bottom of the first conductive structure is in contact with the etching stop layer, and the coefficient of thermal expansion of the first conductive structure is smaller than that of copper.

Exemplarily, the filling region is formed within the intermetallic dielectric layer 12, where a bottom surface of the filling region is flush with a top surface of the etching stop layer.

The first conductive structure is formed within the filling region, where a material of the first conductive structure includes tungsten.

It should be noted that the first conductive structure may be integrated or split, and when the first conductive structure is integrated, a process for forming the first conductive structure may be described as follows.

A first photoresist layer is formed on the intermetallic dielectric layer 12, and the first photoresist layer is patterned such that the first photoresist layer has a first opening.

Figure 7:
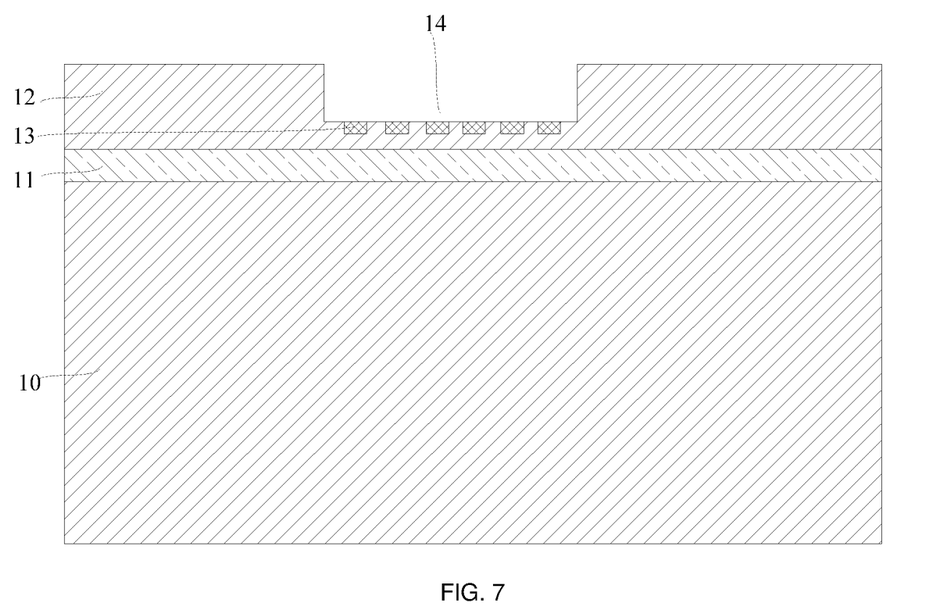
FIG. 7 is a schematic structural diagram of forming a filling region in the method of manufacturing a die according to an embodiment of the disclosure.

As shown in FIG. 7, after the first opening is formed, a part of the intermetallic dielectric layer 12 exposed inside the first opening is removed by using etching gas or etching liquid, so as to form the filling region 14 within the intermetallic dielectric layer 12, where the bottom surface of the filling region 14 is flush with the top surface of the etching stop layer 13, that is, the filling region 14 exposes the top surface of the etching stop layer 13.

Figure 8:
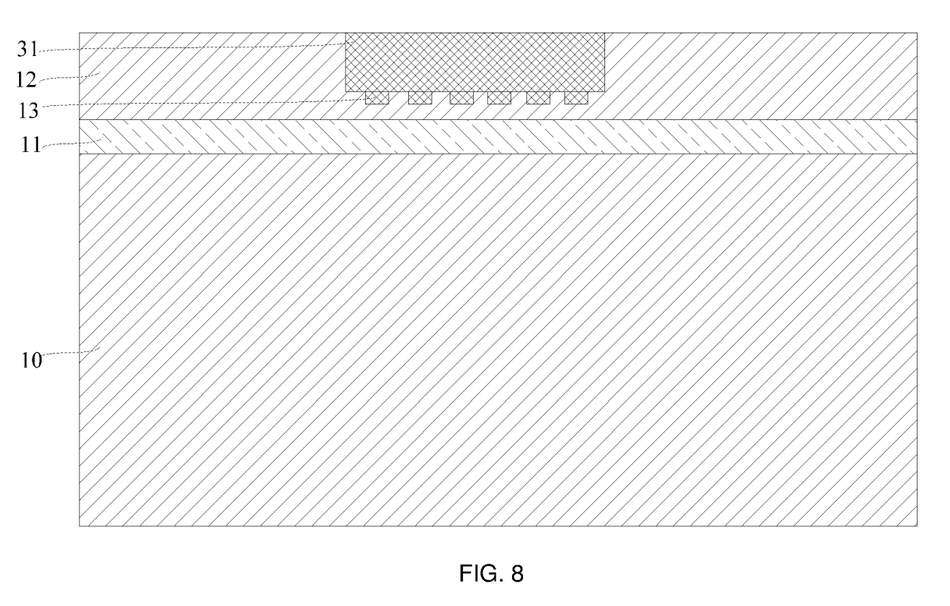
FIG. 8 is a first schematic structural diagram of forming a first conductive structure in the method of manufacturing a die according to an embodiment of the disclosure.

As shown in FIG. 8, after the filling region 14 is formed, the first conductive structure 31 is formed within the filling region 14, where the material of the first conductive structure 31 includes tungsten.

Specifically, tungsten is deposited within the filling region 14 through the physical vapor deposition process or the chemical vapor deposition process, such that the first conductive structure 31 forms an integrated structure, where the coefficient of thermal expansion of tungsten is smaller than that of copper, such that a degree of deformation under heat of the conductive structure is reduced and a gap is prevented from being formed between the substrate and the interconnection structure layer, thereby improving the performance of the die; and the first conductive structure 31 uses the integrated structure, such that a preparation process of the first conductive structure may be simplified.

When the first conductive structure is of a split structure, the first conductive structure 31 may be described in the following two implementations, and it should be noted that the following two implementations are only illustrative of two possible implementations, rather than to limit the structure of the first conductive structure.

Figure 9:
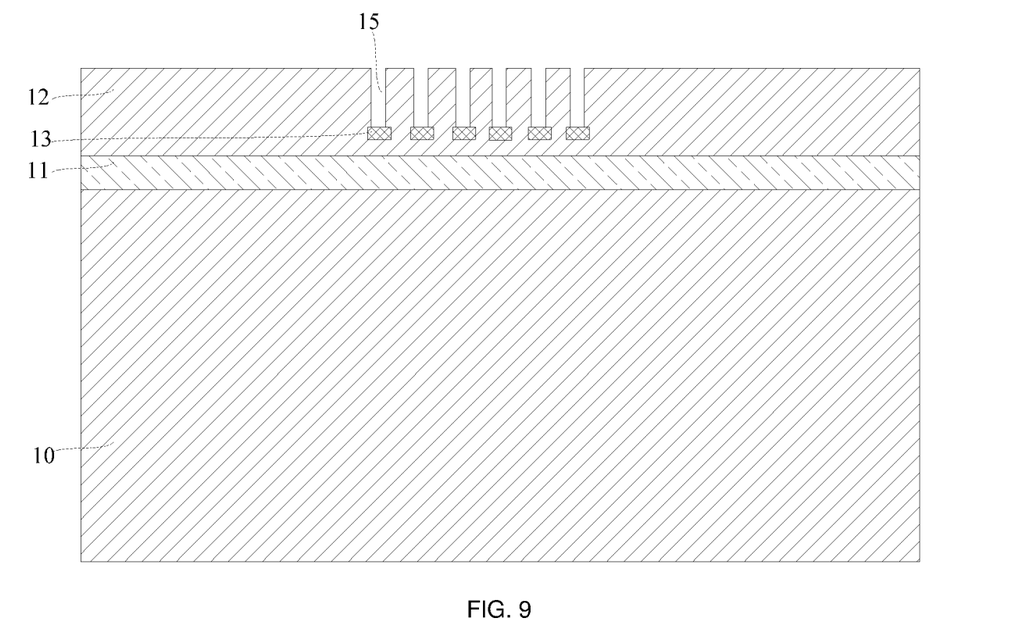
FIG. 9 is a schematic structural diagram of forming a filling hole in the method of manufacturing a die according to an embodiment of the disclosure.

In a possible implementation of the first conductive structure, a plurality of filling holes 15 arranged at intervals are formed within the intermetallic dielectric layer 12, an axis of each filling hole 15 is perpendicular to the substrate 10, and the filling holes 15 expose the top surface of the etching stop layer 13, where the plurality of filling holes 15 form the filling region 14.

Exemplarily, a second photoresist layer is formed on the intermetallic dielectric layer 12, and the second photoresist layer is patterned such that the second photoresist layer has a plurality of second openings arranged at intervals, where, in the embodiment, if the etching stop layer is of a whole surface structure, correspondingly, the second openings expose a part of the top surface of the etching stop layer; and if the etching stop layer includes a plurality of etching stop blocks arranged at intervals, correspondingly, the number of the etching stop blocks corresponds to the number and positions of the second openings one by one.

As shown in FIG. 9, after the second openings are formed, a plurality of filling holes 15 arranged at intervals are formed within the intermetallic dielectric layer 12 by using the etching liquid or the etching gas, where an axis of each filling hole is perpendicular to the substrate 10, and the filling holes 15 expose the top surface of the etching stop layer 13, that is, hole bottoms of the filling holes 15 are the top surface of the etching stop layer 13.

Through the arrangement of the etching stop layer 13, the substrate may be prevented from over etching when the filling holes 15 are formed, thereby improving the performance of the die.

Figure 10:
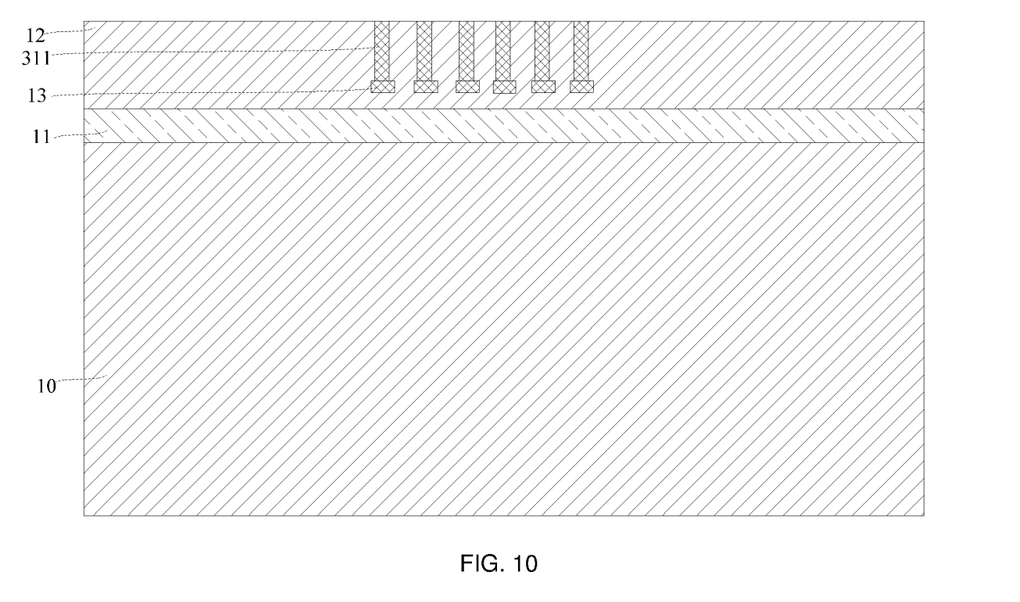
FIG. 10 is a second schematic structural diagram of forming a first conductive structure in the method of manufacturing a die according to an embodiment of the disclosure.

As shown in FIG. 10, after the filling holes 15 are formed, tungsten is deposited within each filling hole 15 through the physical vapor deposition process or the chemical vapor deposition process, such that a cylindrical body 311 is formed in each filling hole 15, where the plurality of cylindrical bodies 311 arranged at intervals form the first conductive structure 31.

Figure 11:
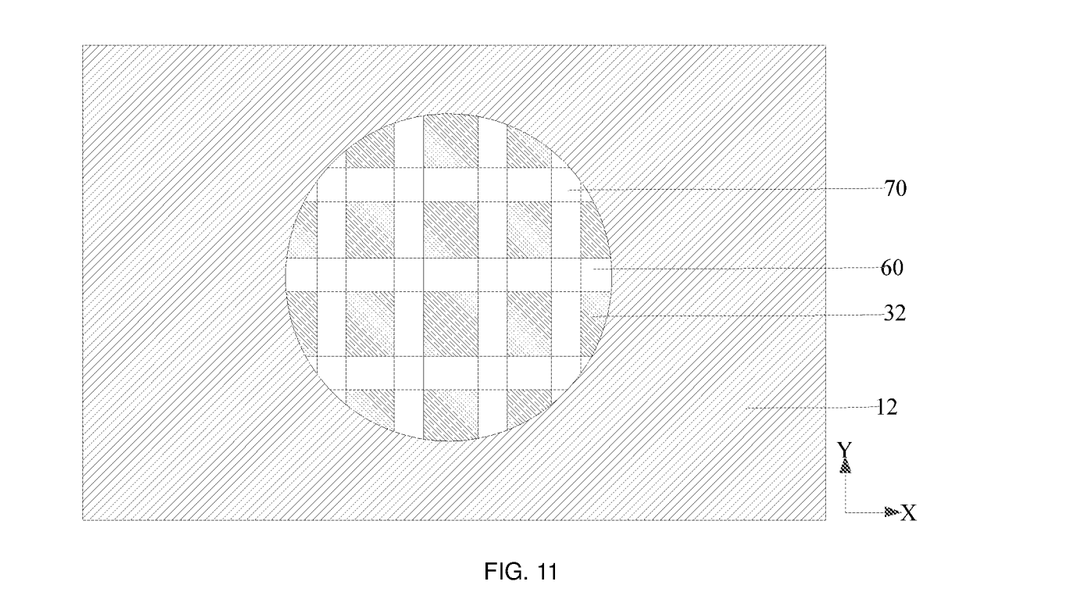
FIG. 11 is a schematic structural diagram of forming a first filling slot and a second filling slot in the method of manufacturing a die according to an embodiment of the disclosure.

In another possible implementation of the first conductive structure, the process steps are as follows:

As shown in FIG. 11, a first filling slot 60 extending along a first direction and a second filling slot 70 extending along a second direction are formed within the intermetallic dielectric layer 12, where the first direction is intersected with the second direction, and both a bottom of the first filling slot 60 and a bottom of the second filling slot 70 are the top surface of the etching stop layer 13.

A process of forming the first filling slot and the second filling slot is similar to a process step of forming a filling slot, which is not repeated herein.

Figure 12:
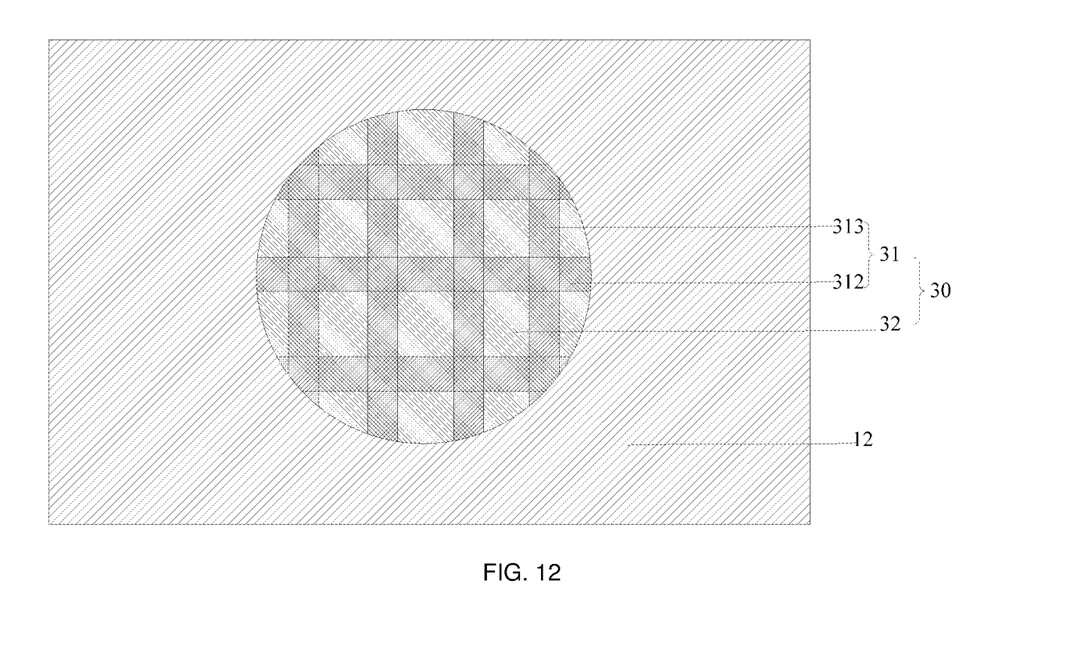
FIG. 12 is a third schematic structural diagram of forming a first conductive structure in the method of manufacturing a die according to an embodiment of the disclosure.

As shown in FIG. 12, tungsten is deposited within the first filling slot through the physical vapor deposition process or the chemical vapor deposition process, so as to form a first strip-shaped body 312, and tungsten is deposited within the second filling slot through the physical vapor deposition process or the chemical vapor deposition process, so as to form a second strip-shaped body 313, where the first strip-shaped body 312 extends along the first direction, the second strip-shaped body 313 extends along the second direction, and the first strip-shaped body 312 and the second strip-shaped body 313 form the first conductive structure 31.

There are one or more first filling slots 60 and second filling slots 70, for example, with further reference to FIG. 11, a plurality of first filling slots 60 and a plurality of second filling slots 70 are formed within the intermetallic dielectric layer 12, the plurality of first filling slots 60 are arranged at intervals along the second direction, the plurality of second filling slots 70 are arranged at intervals along the first direction, and the first direction and the second direction are perpendicular to each other.

Correspondingly, there are a plurality of first strip-shaped bodies 312 and a plurality of second strip-shaped bodies 313; and by using the arrangement of the plurality of first strip-shaped bodies and the plurality of second strip-shaped bodies, the coefficient of thermal expansion of the first conductive structure may be reduced to the greatest extent, and the conductive structure may be prevented from being separated from the interconnection structure layer, thereby improving the performance of the die.

Step 300: form the interconnection structure layer on the intermetallic dielectric layer, where the interconnection structure layer is connected with one end of the first conductive structure away from the substrate.

Figure 13:
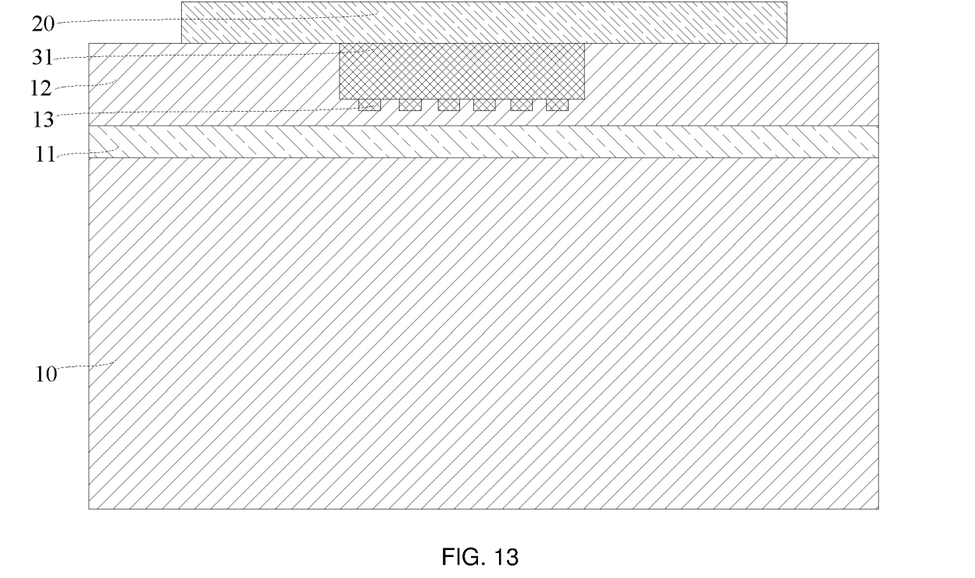
FIG. 13 is a first schematic structural diagram of forming an interconnection structure layer in the method of manufacturing a die according to an embodiment of the disclosure.
Figure 14:
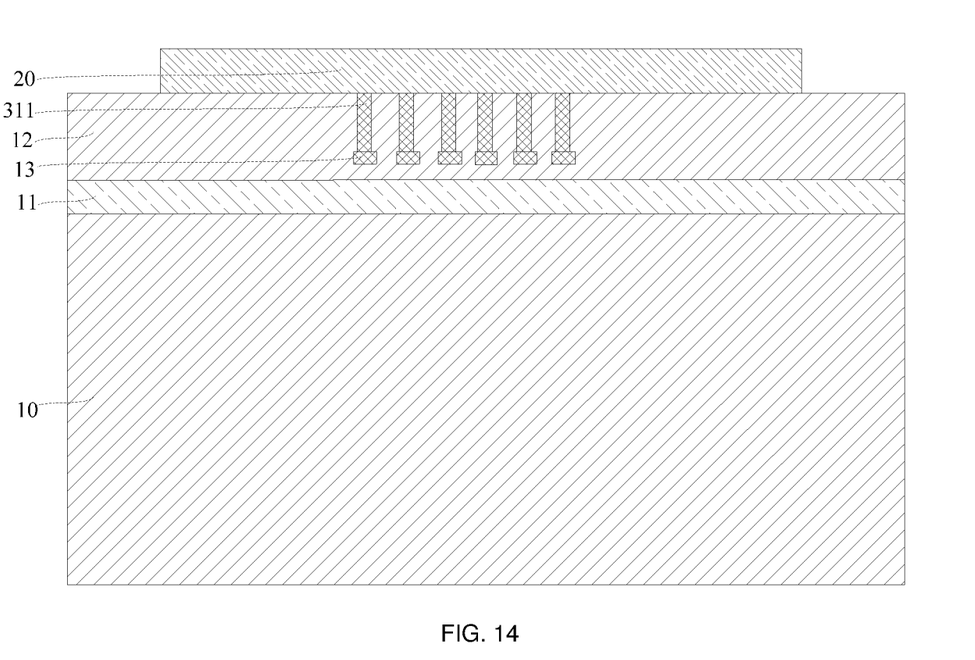
FIG. 14 is a second schematic structural diagram of forming an interconnection structure layer in the method of manufacturing a die according to an embodiment of the disclosure.

Exemplarily, as shown in FIGS. 13 and 14, the interconnection structure layer 20 is formed on the intermetallic dielectric layer 12 by using the physical vapor deposition process or the chemical vapor deposition process, where the interconnection structure layer 20 at least covers on the top surface of the first conductive structure 31.

A wire may be arranged within the interconnection structure layer 20, one end of the wire may be connected with a transistor (not shown in the figures) arranged within the substrate while the other end thereof may be connected with a capacitor (not shown in the figures) arranged within the substrate, and connection between the transistor and the capacitor is achieved through the interconnection structure layer.

Step 400: form a second conductive structure within the substrate, where the second conductive structure extends into the intermetallic dielectric layer and is connected with the first conductive structure.

Figure 15:
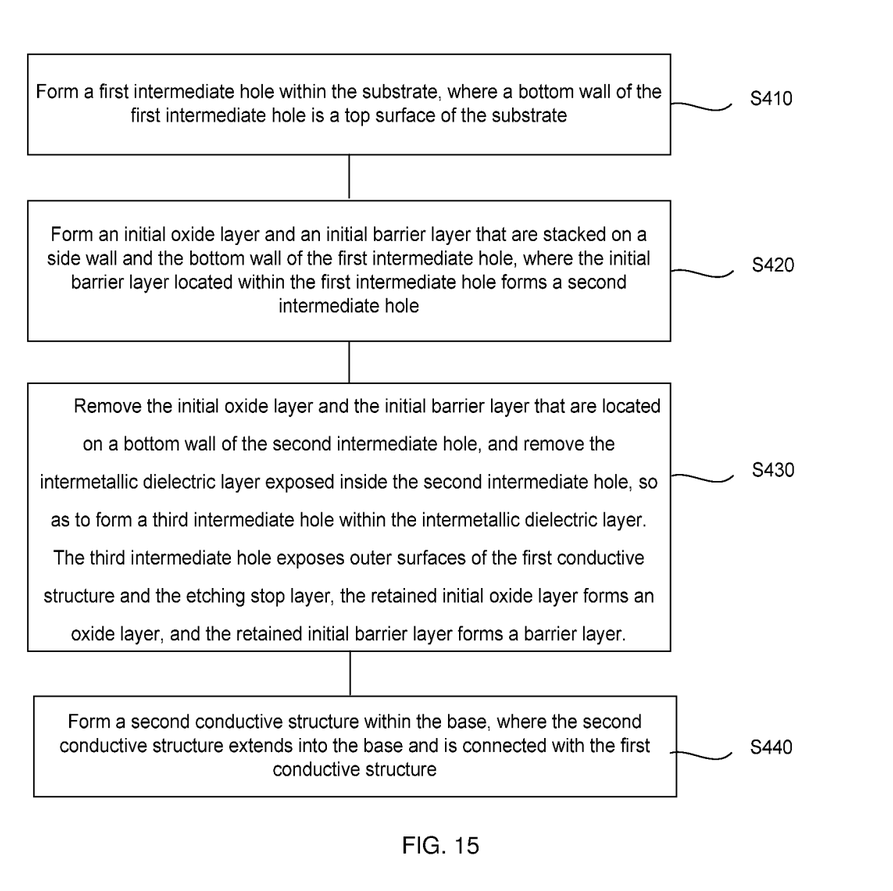
FIG. 15 is a process flowchart of forming a second conductive structure in the method of manufacturing a die according to an embodiment of the disclosure.

Exemplarily, as shown in FIG. 15, step S410: form a first intermediate hole within the substrate, where a bottom wall of the first intermediate hole is the top surface of the substrate.

Figure 16:
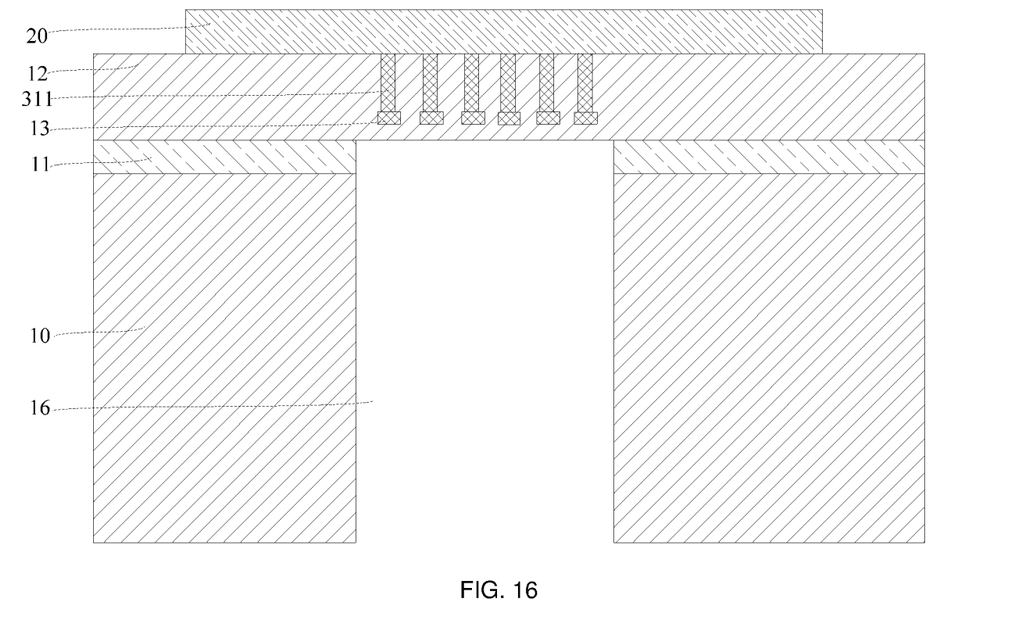
FIG. 16 is a schematic structural diagram of forming a first intermediate hole in the method of manufacturing a die according to an embodiment of the disclosure.

As shown in FIG. 16, the first intermediate hole 16 is formed within the substrate 10. The bottom wall of the first intermediate hole 16 is the top surface of the substrate 10, that is, the first intermediate hole 16 may be formed within the substrate 10 by using the etching liquid or the etching gas. The first intermediate hole 16 exposes the bottom surface of the intermetallic dielectric layer 12, that is, the etching liquid or the etching gas is imported onto the surface of the substrate away from the intermetallic dielectric layer 12, so as to form the first intermediate hole 16.

Step S420: form an initial oxide layer and an initial barrier layer that are stacked on a side wall and the bottom wall of the first intermediate hole, where the initial barrier layer located within the first intermediate hole forms a second intermediate hole.

Figure 17:
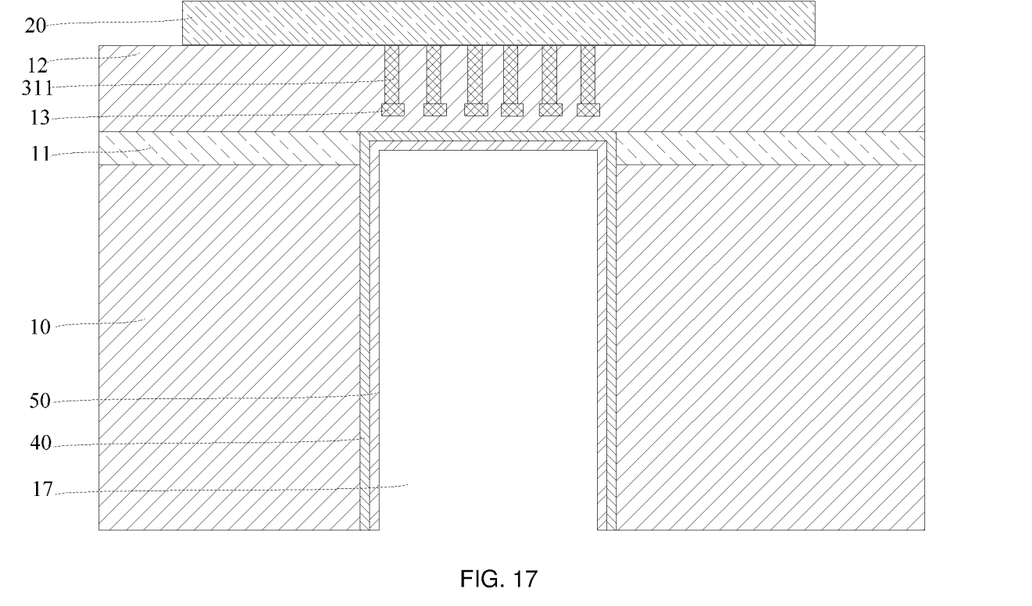
FIG. 17 is a schematic structural diagram of forming an initial oxide layer and an initial barrier layer in the method of manufacturing a die according to an embodiment of the disclosure.

As shown in FIG. 17, after the first intermediate hole 16 is formed, the initial oxide layer 40 and the initial barrier layer 50 that are stacked are formed on the side wall and the bottom wall of the first intermediate hole 16. The initial barrier layer 50 located within the first intermediate hole 16 forms the second intermediate hole 17, that is, the initial oxide layer 40 and the initial barrier layer 50 are formed on the side wall of the first intermediate hole 16 in sequence by using an atomic layer deposition process. A material of the initial oxide layer 40 includes silicon oxide and a material of the initial barrier layer 50 includes tantalum.

Step S430: remove the initial oxide layer and the initial barrier layer that are located on a bottom wall of the second intermediate hole, and remove the intermetallic dielectric layer exposed inside the second intermediate hole, so as to form a third intermediate hole within the intermetallic dielectric layer. The third intermediate hole exposes outer surfaces of the first conductive structure and the etching stop layer, the retained initial oxide layer forms an oxide layer, and the retained initial barrier layer forms a barrier layer.

Figure 18:
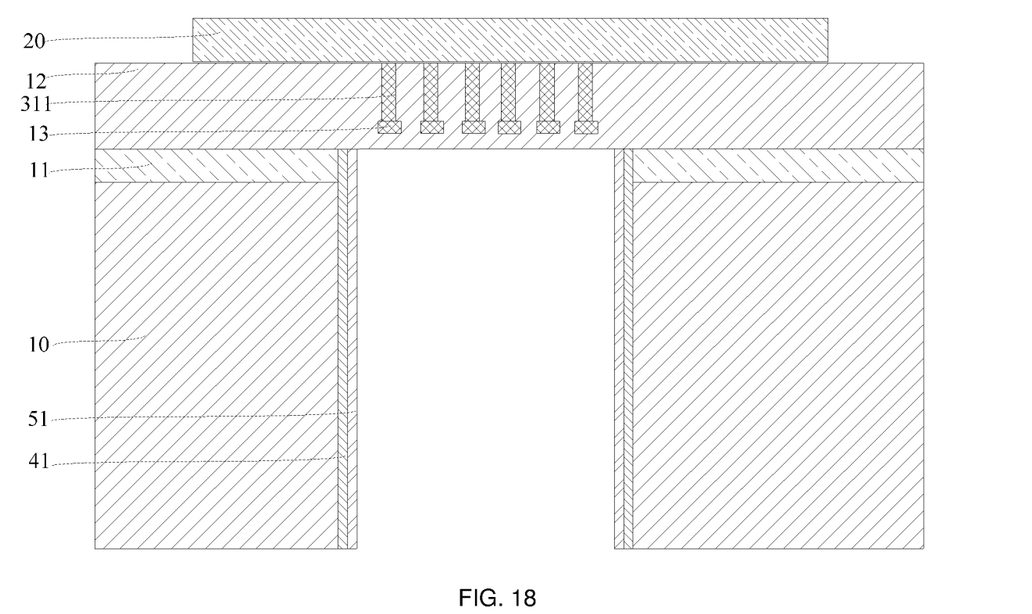
FIG. 18 is a schematic structural diagram of forming an oxide layer and a barrier layer in the method of manufacturing a die according to an embodiment of the disclosure.

As shown in FIG. 18, the initial oxide layer 40 and the initial barrier layer 50 that are located on the bottom wall of the second intermediate hole 17 are removed by using the etching gas, where the retained initial oxide layer 40 forms an oxide layer 41, and the retained initial barrier layer 50 forms a barrier layer 51.

Figure 19:
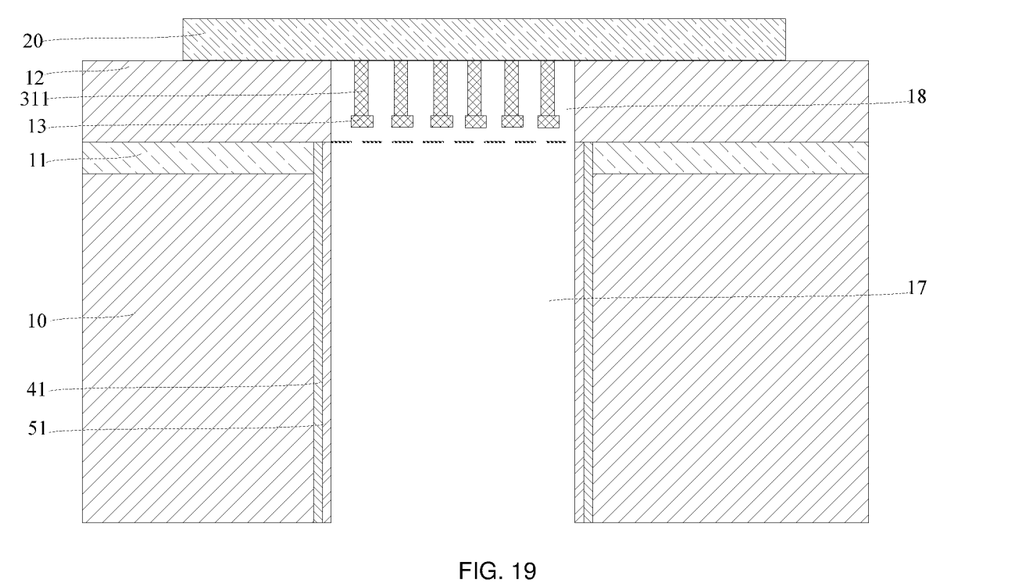
FIG. 19 is a schematic structural diagram of forming a third intermediate hole in the method of manufacturing a die according to an embodiment of the disclosure.

The intermetallic dielectric layer 12 exposed inside the second intermediate hole 17 is removed so as to form the third intermediate hole 18 in the intermetallic dielectric layer 12, where the third intermediate hole 18 exposes the outer surfaces of the first conductive structure 31 and the etching stop layer 13, and a structure thereof is as shown in FIG. 19.

It should be noted that, in FIG. 19, a region above a dotted line is the third intermediate hole 18, and a region below the dotted line is the second intermediate hole 17.

Step S440: form the second conductive structure within the second intermediate hole and the third intermediate hole, where a material of the second conductive structure includes copper.

Copper is deposited within the second intermediate hole 17 and the third intermediate hole 18 by using the chemical vapor deposition process or the physical vapor deposition process. The copper fills the second intermediate hole 17 and the third intermediate hole 18 to form the second conductive structure 32, that is, the second conductive structure 32 wraps the outer surfaces of the first conductive structure 31 and the etching stop layer 13.

It should be noted that when the first conductive structure 31 is of an integrated structure, a process of forming the second conductive structure is same as the above process, which is not repeated herein.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the above embodiments are merely used to explain the technical solutions of the disclosure, but are not intended to limit the disclosure. Although the disclosure is described in detail with reference to the foregoing embodiments, those of ordinary skill in the art should understand that they can still modify the technical solutions described in the foregoing embodiments, or make equivalent substitutions on some or all technical features therein. These modifications or substitutions do not make the essence of the corresponding technical solutions deviate from the spirit and scope of the technical solutions of the embodiments of the disclosure.

The invention claimed is:

1. A die, comprising:
a substrate, wherein an interconnection structure layer is arranged on the substrate; and
a conductive structure arranged within the substrate, wherein the conductive structure comprises a first conductive structure and a second conductive structure connected with the first conductive structure, the first conductive structure is connected with the interconnection structure layer, a coefficient of thermal expansion of the first conductive structure is smaller than a coefficient of thermal expansion of copper, and a coefficient of thermal expansion of the second conductive structure is smaller than the coefficient of thermal expansion of copper.

2. The die according to claim 1, wherein the first conductive structure is arranged within the second conductive structure, a top surface of the first conductive structure is flush with a top surface of the second conductive structure, and a material of the second conductive structure is same as a material of the first conductive structure.

3. The die according to claim 2, wherein the first conductive structure comprises a plurality of cylindrical bodies arranged at intervals, and axes of the plurality of cylindrical bodies are perpendicular to the substrate.

4. The die according to claim 3, wherein by taking a plane parallel to the substrate as a cross section, cross sections of the plurality of cylindrical bodies are circular or polygonal.

5. The die according to claim 2, wherein the first conductive structure comprises a first strip-shaped body and a second strip-shaped body intersected with the first strip-shaped body, and both a depth direction of the first strip-shaped body and a depth direction of the second strip-shaped body are perpendicular to the substrate.

6. The die according to claim 5, wherein the first strip-shaped body extends along a first direction, the second strip-shaped body extends along a second direction, and the first direction is intersected with the second direction.

7. The die according to claim 6, wherein the first direction and the second direction are perpendicular to each other.

8. The die according to claim 7, wherein there are a plurality of first strip-shaped bodies and the plurality of first strip-shaped bodies are arranged at intervals along the second direction; and there are a plurality of second strip-shaped bodies and the plurality of second strip-shaped bodies are arranged at intervals along the first direction.

9. The die according to claim 8, wherein by taking a plane perpendicular to the substrate as a longitudinal section, both longitudinal sections of the plurality of first strip-shaped bodies and the plurality of second strip-shaped bodies are rectangular.

10. The die according to claim 1, wherein an intermetallic dielectric layer is further arranged on the substrate, the first conductive structure is arranged within the intermetallic dielectric layer, and one part of the second conductive structure is arranged within the substrate while a second part of the second conductive structure is arranged within the intermetallic dielectric layer.

11. A memory, comprising a plurality of dies according to claim 1, wherein the plurality of dies are stacked in sequence, and two adjacent layers of dies are connected through the interconnection structure layer.

12. A method of manufacturing a die, comprising:
providing a substrate, wherein an intermetallic dielectric layer is arranged on the substrate, and an etching stop layer is arranged within the intermetallic dielectric layer;
forming a first conductive structure within the intermetallic dielectric layer, wherein a bottom of the first conductive structure is in contact with the etching stop layer, and a coefficient of thermal expansion of the first conductive structure is smaller than a coefficient of thermal expansion of copper;
forming an interconnection structure layer on the intermetallic dielectric layer, wherein the interconnection structure layer is connected with one end of the first conductive structure away from the substrate; and
forming a second conductive structure within the substrate, wherein the second conductive structure extends into the intermetallic dielectric layer and is connected with the first conductive structure.

13. The method of manufacturing a die according to claim 12, wherein the forming a first conductive structure within the intermetallic dielectric layer comprises:
forming a filling region within the intermetallic dielectric layer, wherein a bottom surface of the filling region is flush with a top surface of the etching stop layer; and
forming the first conductive structure within the filling region, wherein a material of the first conductive structure comprises tungsten.

14. The method of manufacturing a die according to claim 13, wherein the forming a filling region within the intermetallic dielectric layer comprises:
forming a plurality of filling holes arranged at intervals within the intermetallic dielectric layer, wherein an axis of each of the plurality of filling holes is perpendicular to the substrate, the plurality of filling holes expose the top surface of the etching stop layer, and the plurality of filling holes form the filling region.

15. The method of manufacturing a die according to claim 14, wherein the forming the first conductive structure within the filling region comprises:

forming a cylindrical body in each of the plurality of filling holes, wherein a plurality of cylindrical bodies form the first conductive structure.

16. The method of manufacturing a die according to claim 13, wherein the forming a filling region within the intermetallic dielectric layer comprises:
forming a first filling slot extending along a first direction and a second filling slot extending along a second direction within the intermetallic dielectric layer, wherein the first direction is intersected with the second direction, both a bottom of the first filling slot and a bottom of the second filling slot are the top surface of the etching stop layer, and the first filling slot and the second filling slot form the filling region.

17. The method of manufacturing a die according to claim 16, wherein the forming a first filling slot extending along a first direction and a second filling slot extending along a second direction within the intermetallic dielectric layer comprises:
forming a plurality of first filling slots and a plurality of second filling slots within the intermetallic dielectric layer, wherein the plurality of first filling slots are arranged at intervals along the second direction, and the plurality of second filling slots are arranged at intervals along the first direction.

18. The method of manufacturing a die according to claim 17, wherein the forming the first conductive structure within the filling region comprises:
forming first strip-shaped bodies within the plurality of first filling slots and forming second strip-shaped bodies within the plurality of second filling slots, wherein the first strip-shaped bodies and the second strip-shaped bodies form the first conductive structure.

19. The method of manufacturing a die according to claim 12, wherein the forming a second conductive structure within the substrate comprises:
forming a first intermediate hole within the substrate, wherein a bottom wall of the first intermediate hole is a top surface of the substrate;
forming an initial oxide layer and an initial barrier layer that are stacked on a side wall and the bottom wall of the first intermediate hole, wherein the initial barrier layer located within the first intermediate hole forms a second intermediate hole;
removing the initial oxide layer and the initial barrier layer that are located on a bottom wall of the second intermediate hole, and removing the intermetallic dielectric layer exposed inside the second intermediate hole, so as to form a third intermediate hole within the intermetallic dielectric layer, wherein the third intermediate hole exposes outer surfaces of the first conductive structure and the etching stop layer, and a retained portion of the initial oxide layer forms an oxide layer while a retained portion of the initial barrier layer forms a barrier layer; and
forming the second conductive structure within the second intermediate hole and the third intermediate hole, wherein a material of the second conductive structure comprises copper.

* * * * *